United States Patent
Piper et al.

(10) Patent No.: US 11,327,103 B2
(45) Date of Patent: May 10, 2022

(54) HOME LEAKAGE (HL) DETECTION WITH DIRECTION-TO-SOURCE INDICATION

(71) Applicant: VIAVI SOLUTIONS INC., San Jose, CA (US)

(72) Inventors: Marius-Laurentiu Piper, San Jose, CA (US); Bogdan Enciu, San Jose, CA (US)

(73) Assignee: VIAVI SOLUTIONS INC., San Jose, CA (US)

( * ) Notice: Subject to any disclaimer, the term of this patent is extended or adjusted under 35 U.S.C. 154(b) by 30 days.

(21) Appl. No.: 16/859,307

(22) Filed: Apr. 27, 2020

(65) Prior Publication Data
US 2021/0333314 A1 Oct. 28, 2021

(51) Int. Cl.
*G01R 31/52* (2020.01)
*G01R 31/08* (2020.01)
*G01C 21/20* (2006.01)

(52) U.S. Cl.
CPC ........... *G01R 31/083* (2013.01); *G01C 21/20* (2013.01); *G01R 31/52* (2020.01)

(58) Field of Classification Search
CPC ............ G01R 31/08–086; G01R 31/50; G01R 31/52; G01C 21/20
See application file for complete search history.

(56) References Cited

U.S. PATENT DOCUMENTS

| | | | | |
|---|---|---|---|---|
| 5,294,937 A * | 3/1994 | Ostteen | ................. | G01R 31/52 342/459 |
| 6,801,162 B1 * | 10/2004 | Eckenroth | ................. | G01S 3/54 342/417 |
| 2004/0210938 A1 * | 10/2004 | Eckenroth | ................. | G01S 3/54 725/107 |
| 2007/0022457 A1 * | 1/2007 | Eckenroth | ............. | G01R 31/52 725/107 |
| 2008/0033698 A1 * | 2/2008 | Stelle | ..................... | G01R 31/52 702/189 |
| 2008/0133308 A1 * | 6/2008 | Harris | .................... | H04N 17/00 705/7.13 |
| 2010/0026310 A1 * | 2/2010 | Shimp | .................. | G01R 31/083 324/527 |
| 2010/0280773 A1 * | 11/2010 | Saether | .................. | G01R 31/12 702/58 |
| 2011/0043640 A1 * | 2/2011 | Zinevich | ............ | H04N 21/4382 348/192 |
| 2012/0116697 A1 * | 5/2012 | Stelle, IV | .............. | H04N 17/00 702/59 |
| 2015/0181442 A1 * | 6/2015 | Zinevich | ............. | H04B 17/318 455/424 |
| 2016/0036492 A1 * | 2/2016 | Williams | ................. | H04B 1/16 375/228 |
| 2016/0299183 A1 * | 10/2016 | Lee | .......................... | G01V 3/15 |
| 2017/0016947 A1 * | 1/2017 | Polzer | .................. | H02H 1/0007 |
| 2017/0019148 A1 * | 1/2017 | Williams | ................ | G01S 13/06 |
| 2017/0272184 A1 * | 9/2017 | Zinevich | ................ | G01S 11/10 |

(Continued)

*Primary Examiner* — Patrick Assouad
*Assistant Examiner* — Demetrius R Pretlow
(74) *Attorney, Agent, or Firm* — DLA Piper LLP (US)

(57) ABSTRACT

A method, an apparatus and a system that may be configured to determine and provide a direction-to-source indicator on a signal level meter or other test instrument that may be used by a user of the meter (e.g., a technician, maintenance personnel or other personnel) to locate the source of leakage such as home leakage (HL).

16 Claims, 6 Drawing Sheets

(56) References Cited

U.S. PATENT DOCUMENTS

| | | | | |
|---|---|---|---|---|
| 2019/0064244 A1* | 2/2019 | He | ............. | A43B 7/36 |
| 2019/0107572 A1* | 4/2019 | Williams | ............. | H04B 3/462 |
| 2019/0304625 A1* | 10/2019 | Gray | ............. | H01B 7/32 |
| 2020/0320650 A1* | 10/2020 | Agouridis | ............. | G01D 21/02 |
| 2021/0132133 A1* | 5/2021 | Wolcott | ............. | H04W 4/025 |

* cited by examiner

HOME LEAKAGE (HL) DETECTION WITH DIRECTION-TO-SOURCE INDICATION

BACKGROUND

Most cable network systems are coaxial-based broadband access systems that may take the form of all-coax network systems, hybrid fiber coax (HFC) network systems, or RF over glass (RFOG) network systems. Cable network system designs typically use a tree-and-branch architecture that permits bi-directional data transmission, including Internet Protocol (IP) traffic between the cable system head-end and customer locations. There is a forward or downstream signal path (from the cable system head-end to the customer location) and a return or upstream signal path (from the customer location back to the cable system head-end). The upstream and the downstream signals occupy separate frequency bands. In the United States, the frequency range of the upstream band is from 5 MHz to 42 MHz, 5 MHz to 65 MHz, 5 MHz to 85 MHz, or 5 MHz to 204 MHz, while the downstream frequency band is positioned in a range above the upstream frequency band.

Customer locations may include, for example, cable network system (e.g., CATV) subscriber's premises. Typical signals coming from a CATV installation at the subscriber's premises include, for example, set top box DVR/On-Demand requests, test equipment data channels, and Internet Protocol output cable modem carriers defined by the Data Over Cable Service Interface Specification ("DOCSIS"), which is one communication standard for bidirectional data transport over a cable network system.

Egress or leakage from the cable network system results from flaws in the cable network system that provide points of ingress for noise, which can reduce the quality of service of the system. Service operators have utilized two basic types of leakage detection gear to locate such points of ingress. One type of gear utilizes a signal level meter with an antenna designed to receive signals in the cable network system band. A maintenance/service technician walks around a subscriber's premises monitoring the signal level meter to identify flaws in the wiring and network devices at the subscriber's premises.

The other type of gear is so-called "truck-mounted" units, which are mounted in vehicles that are driven along the data lines and nodes of the cable network system, generally by maintenance/service technicians, to monitor leakage along the cable network system. One example of a test procedure and associated instrumentation for locating leakage is shown and described in U.S. Pat. No. 10,110,888, which is incorporated herein by reference in its entirety.

While current leakage detection equipment and methods are suitable for monitoring signal levels attributable to home leakage (HL), they are not without their shortcomings. For example, the current equipment and methods do not actively direct the technician to the source of the leakage. Instead, the technician is tasked with maneuvering unguided throughout the premises until the leakage source is detected. This may be time consuming and can increase labor costs, which are undesirable. Accordingly, there is a need and desire for a better technique to locate the source of leakage such as home leakage (HL).

DETAILED DESCRIPTION OF SEVERAL EMBODIMENTS

Embodiments described herein may be configured to determine and provide a direction-to-source indicator on a signal level meter or other test instrument that may be used by a user of the meter (e.g., a technician, maintenance personnel or other personnel) to locate the source of leakage such as home leakage (HL).

In one or more embodiments, an inertial measurement unit (IMU) is connected to or integrated with the meter to measure movement of the meter and hence the user. Data from the IMU, providing information of the movement of the meter, is used in combination with leakage signal levels received by the meter's antenna to determine a direction to the source of the leakage. The determined direction may be provided on a display of the meter as a direction-to-source of HL leakage indicator. In one or more embodiments, the direction-to-source indicator may be implemented graphically as a compass, directional arrows and or other indicators.

Current signal level meters/test instruments such as the OneExpert CATV line of analysis meters manufactured and sold by VIAVI Solutions Inc. allow the measuring of the level of two tagged test signals: a low-frequency test signal at about 138 MHz and a high-frequency test signal at about 757.5 MHz. In one or more embodiments, by evaluating the differences between the received signal levels for the two test signals combined with the determined position changes of the meter (i.e., caused by movement of the technician) the disclosed principles can estimate the direction to the source of the leakage. The estimated direction may be output on the display of the meter via a graphical direction-to-source indicator to guide the technician to the source of the leakage.

Figure 1:
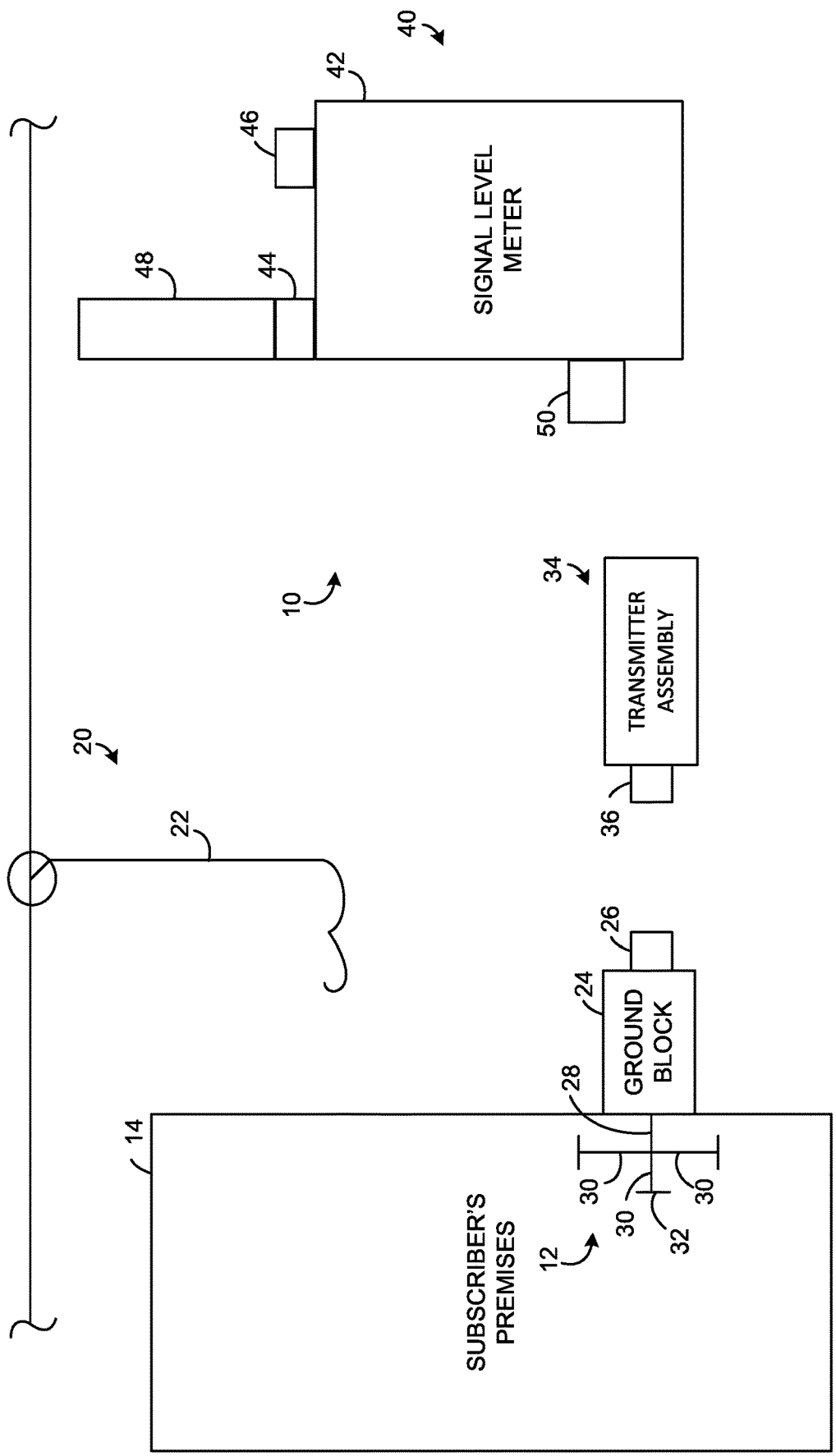
FIG. 1 shows a block diagram illustrating a cable network system, a subscriber's premises, and an instrument system including a signal level meter in accordance with the disclosed principles.

Referring now to FIG. 1, an instrument system 10 for use in locating leakage in a CATV installation 12 at a subscriber's premises 14 is shown. In one or more embodiments, the system 10 may also determine a direction to the source of the leakage and provide a direction-to-source of HL leakage indicator on a signal level meter 40 of the system 10.

In the illustrative embodiment, the cable network system 20 may be connected to a subscriber's premises 14 via a data line or cable 22 to provide signals including programming material to the subscriber. The cable network system 20 includes a head end (not shown) where programming material is obtained and modulated onto appropriate carriers for distribution to a number of subscriber's premises 14. Subscribers' premises 14 may include offices, homes, apartments, or other spaces at which CATV content is desired.

The carriers may be combined for distribution downstream to subscribers over what is typically referred to as the forward path. Signals going upstream from subscribers' premises are typically routed in what is called the return path.

The cable 22 may be connected to the subscriber's premises 14 at a ground block 24. In the illustrative embodiment, the cable 22 is a coaxial cable. In other embodiments, the cable may include coaxial cable and/or optical fiber that transports the CATV signals. In some embodiments, the CATV signals are transported as radio frequencies (RF). The signals may also be transported in hybrid systems including optical transmission portions in which the RF signals are converted to light for fiber optic transmission over some portions of the signal path and as RF signals over other portions of the signal path.

The ground block 24 is illustratively coupled to the subscriber's premises 14 and includes a connector 26 configured to be coupled to the cable 22. From the ground block 24, a cable 28 enters the house and connects to the CATV installation 12. The CATV installation 12 defines a "tree and branch" topology with the different branches 30 connecting various outlets 32 to the ground block 24.

The illustrated embodiment of the instrument system 10 includes a transmitter assembly 34, an antenna assembly 48 configured to receive signals generated by the transmitter assembly 34, and the signal level meter 40 configured to be coupled to the antenna assembly 48 at a first connector 44. As described in greater detail below, the instrument system 10 also includes an inertial measurement unit 50. As shown in FIG. 1, the transmitter assembly 34 includes a connector 36 that is configured to be coupled to the connector 26 of the ground block 24 when the cable 22 is disconnected. For example, the transmitter assembly 34 may be operable to generate signals in a number of frequency sub-bands over a frequency range of about 100 MHz to about 1.2 GHz, and the antenna assembly 48 includes circuitry tuned to each frequency sub-band to receive signals generated by the transmitter assembly 34 over the frequency range. One example of a transmitter assembly for generating output signals is shown and described in U.S. Pat. No. 10,110,888.

As described above, the connector 36 is configured to be coupled to the connector 26 of the ground block 24 to physically connect the transmitter assembly 34 to the ground block 24. With the transmitter assembly 34 connected to the ground block 24, a technician may energize the transmitter assembly 34 to supply the signals to the CATV installation 12 at the subscriber's premises 14 via the ground block 24.

In the illustrative embodiment, the signal level meter 40 is further connected to the inertial measurement unit 50. As described above, during the leakage test, the maintenance/service technician walks around the subscriber's premises 14 with the signal level meter 40 to identify flaws in the wiring and network devices at the subscriber's premises 14. During this leakage test, the inertial measurement unit 50 is configured to generate inertial data, which is used to determine a motion activity of the inertial measurement unit 50. In the illustrative embodiment, the signal level meter 40 is configured to determine a direction to a source of leakage based on the motion activity of the inertial measurement unit 50 and the signal levels received by the antenna assembly 48 (described in more detail below). It should be appreciated that, in some embodiments, the inertial measurement unit 50 may be connected to, incorporated in, or otherwise form a portion of, the signal level meter 40.

Figure 2:
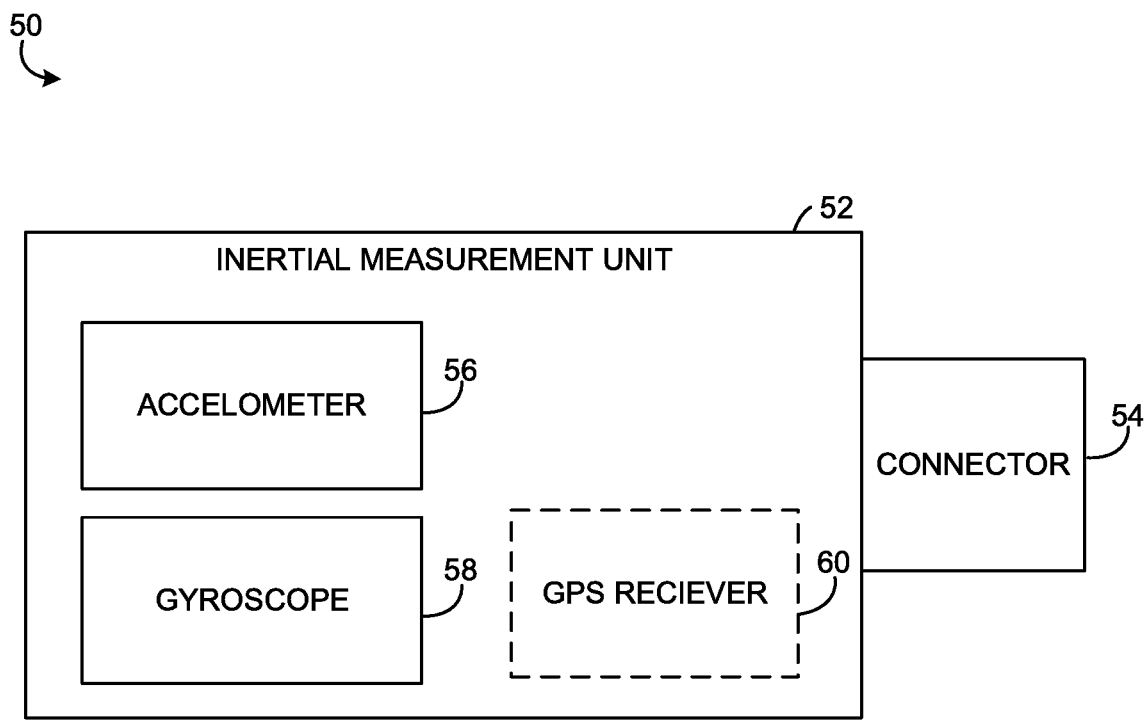
FIG. 2 is a block diagram of an example inertial measurement unit that may be used with the signal level meter of FIG. 1.

Referring now to FIG. 2, the inertial measurement unit 50 includes an outer casing 52 that houses various electronic components for generating the inertial data of inertial measurement unit 50. Specifically, in the illustrative embodiment, the inertial measurement unit 50 includes an accelerometer 56 and a gyroscope 58 for generating the inertial data indicative of an orientation and an angular velocity of the signal level meter 40. In some embodiments, the inertial measurement unit 50 may include a global positioning system (GPS) receiver 60. In such embodiments, the inertial data may include data generated by the GPS receiver 60 that indicates a geolocation of the signal level meter 40. For example, the inertial measurement unit 50 may be a USB inertial measurement device that are commercially available from Robert Bosch LLC. (e.g., Sensortec BNO055 USB Stick), YOST LABS (e.g., 3-Space™ Micro USB), or Yoctopuce (e.g., Yocto-3D). Such USB inertial measurement unit 50 includes a microcontroller (not shown) connected to a connector 54 that acts as an interface to the I/O port 78 of the signal level meter 40.

Figure 3:
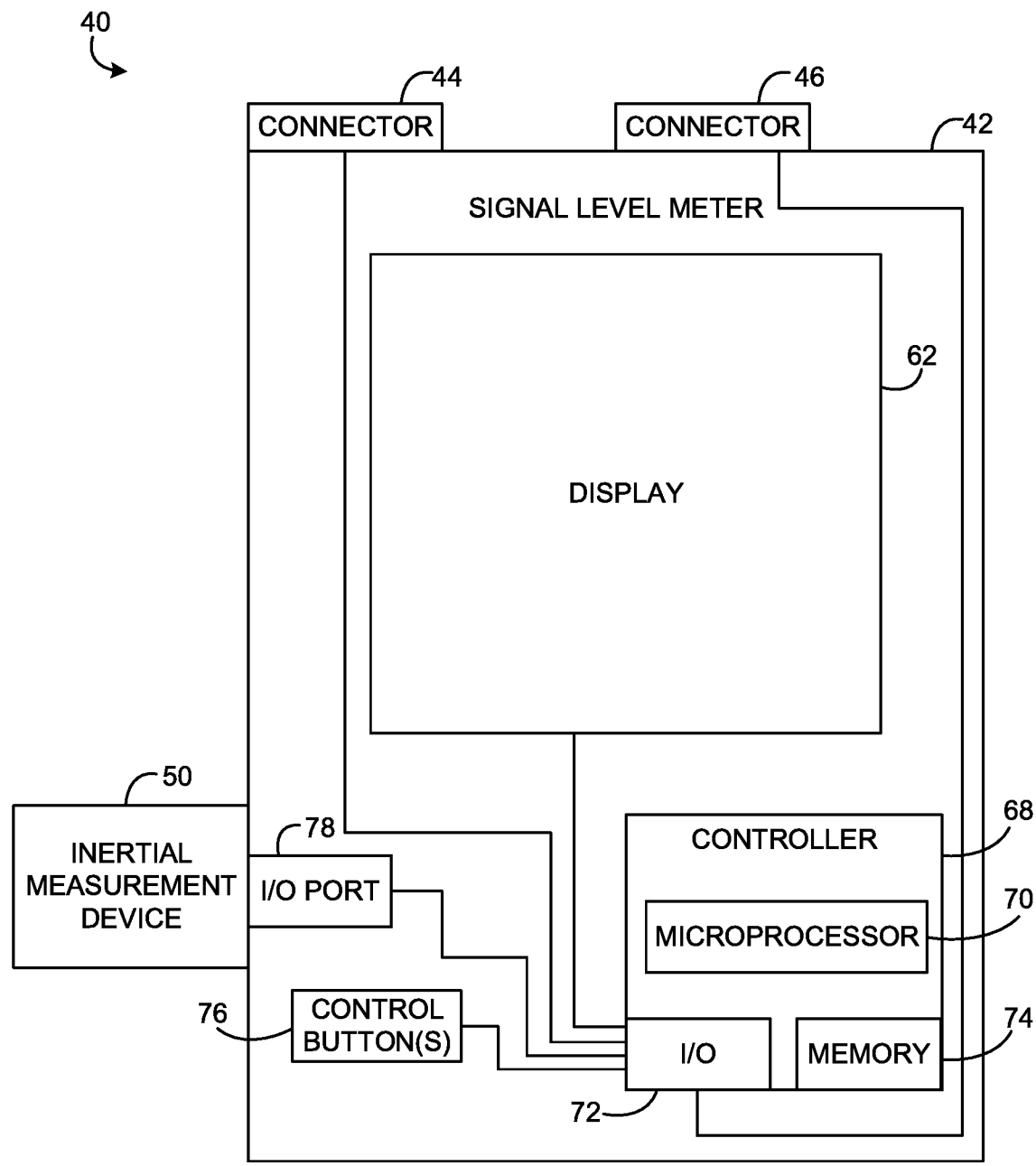
FIG. 3 is a block diagram of an example signal level meter use in the instrument system of FIG. 1.

Referring now to FIG. 3, the signal level meter 40 includes an outer casing 42 that houses various electronic components for analyzing the signals received via the first connector 44 and other connectors, including, for example, second connector 46. In the illustrative embodiment, the signal level meter 40 includes a touchscreen display 62 and various control buttons 76 that may be utilized by the technician to operate the signal level meter 40 and analyze signals received by it. The signal level meter 40 also includes an Input/Output (I/O) port 78 such as, for example, a USB port, that is configured to be connected to the inertial measurement unit 50. It should be appreciated that, in some embodiments, the I/O port 78 may be embodied as a wireless port that is wirelessly connected to the inertial measurement unit 50 via wireless technology such as, for example, Bluetooth technology.

As described further below, the signal level meter 40 is further configured to analyze data received via the I/O port 78 from an I/O device such as, for example, the inertial measurement unit 50. In some embodiments, the signal level meter 40 may also include a speaker or other device operable to generate audible signals.

The signal level meter 40 also includes an electronic control unit (ECU) or "electronic controller" 68, which is configured to control the operation of the signal level meter 40. The electronic controller 68 may include a Digital Signal Processor (DSP), but in other embodiments, the controller 68 may include one or more Field Programmable Gate Arrays (FPGA) and Cable Modem Chips. Each of the components described above (e.g., the display 62, connectors 44, 46, the control buttons 76, the I/O port 78, and so forth) is connected to the electronic controller 68 via a number of communication links such as printed circuit board traces, wires, cables, and the like.

The electronic controller 68 includes, among other components customarily included in such devices, a processor such as a microprocessor 70, input/output interface (I/O) 72, and a memory device 74 such as a programmable read-only memory device ("PROM") including erasable PROM's (EPROM's or EEPROM's). The memory device 74 is a non-transitory computer readable medium and may be provided to store, among other things, instructions in the form of, for example, a software routine (or routines) which, when executed by the microprocessor 70, allows the electronic controller 68 to control operation of the signal level meter 40 (and hence, for example, the antenna assembly 48). In the illustrative embodiment, the memory device 74 has stored therein a number of normalization tables associated with the range of possible drop levels of the subscriber's premises 14 and the range of possible transmit levels of the transmitter assembly 34.

Figure 4:
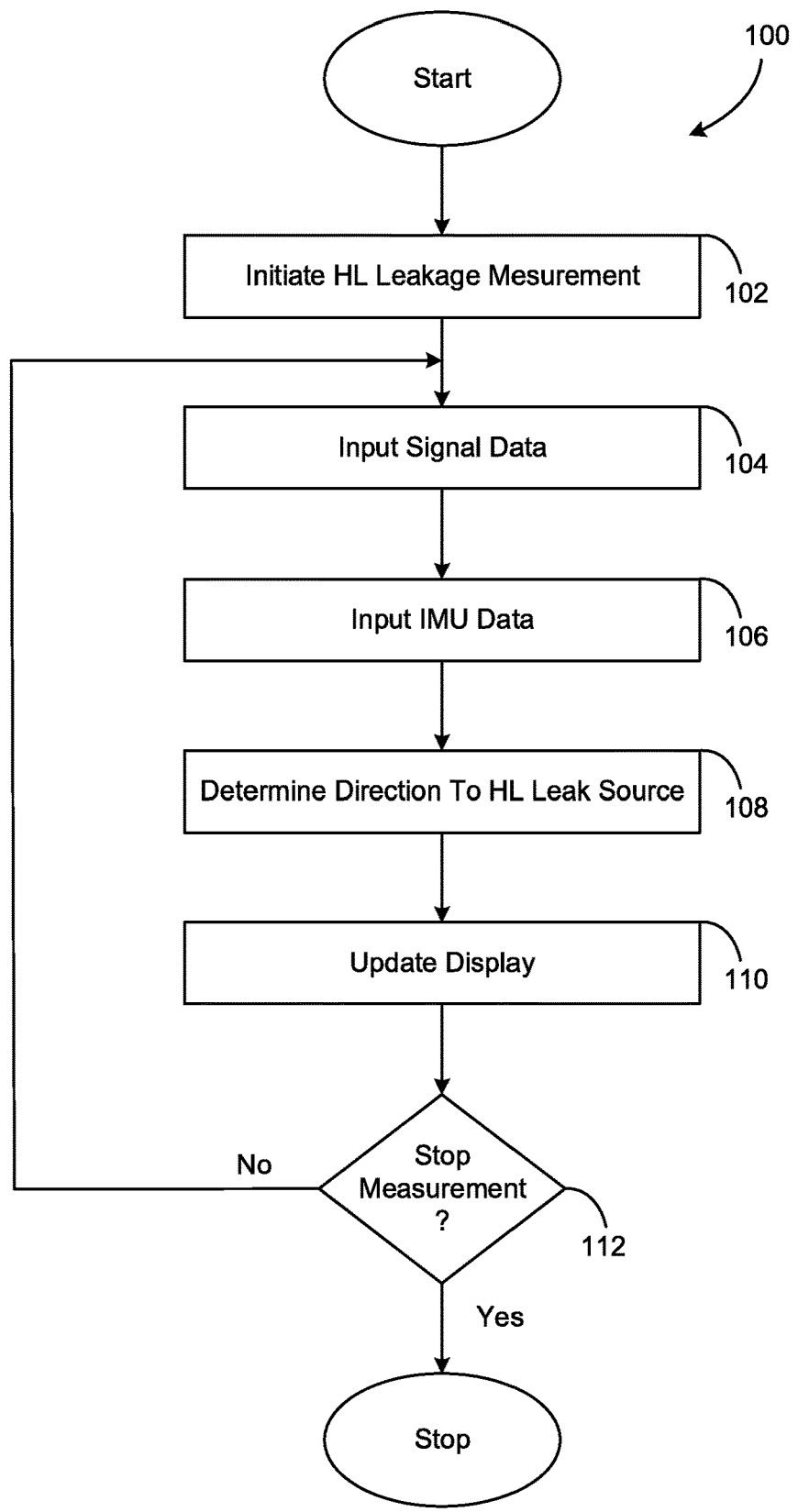
FIG. 4 shows an example process for determining and providing a direction to a source of leakage within a premises that may be performed by the signal level meter of FIG. 1.

FIG. 4 illustrates an example process 100 for determining and providing a direction to a source of leakage within a premises that may be performed by the signal level meter 40 of FIG. 1. In one or more embodiments, the process 100 may output a graphical direction-to-source of leakage indicator on the signal level meter 40. In one or more embodiments, the signal level meter 40 may be a meter equipped to detect leakage from the OneExpert CATV line of analysis meters manufactured and sold by VIAVI Solutions Inc.

In one or more embodiments, before the process 100 is initiated, two test carriers at two respective frequencies may be injected at the ground block 24 with a defined relationship to the system levels at those frequencies. For example, as described in U.S. Pat. No. 10,110,888, a technician may disconnect the cable 22 at the subscriber's premises' ground block 24 and connect the transmitter assembly 34 to the ground block 24. Two signals, one in the aircraft band and one in the LTE band, may be provided to the premises' internal cable installation 12. Illustrative signals are an approximately 139.25 MHz carrier wave (CW) signal in the aircraft band and an approximately 750 MHz CW signal in the LTE band. These signals may be provided at high levels. For example, if the cable 22 signal is provided to the ground block 24 at −5 to 0 dBmV, the transmitter assembly 34 may provide 60 dBmV signals at the selected frequencies to the ground block 24.

The process 100 may begin at step 102 when the controller 68 of the signal level meter 40 starts a leakage test to determine whether leakage is detected at the subscriber's premises 14. For example, the controller 68 may start the leakage test in response to receiving an indication from the maintenance/service technician to start the leakage test (e.g., via a menu selection and or function key selection using the control buttons 76).

Once the leakage test is active, at step 104, the controller 68 receives the test signals from the antenna assembly 48. The level of each test signal is input by the controller 68 and may be stored in the memory 74 for further processing.

At step 106, the controller 68 receives inertial data from the inertial measurement unit 50 secured to the signal level meter 40 (e.g., via the I/O port 78 of the signal level meter 40 if the unit 50 is not integrated within the meter 40). As can be appreciated, during the leakage test, a maintenance/service technician may walk around the subscriber's premises 14 monitoring leakage signals detected by the signal level meter 40 to identify flaws in the wiring and network devices at the subscriber's premises 14. Concurrently, the inertial measurement unit 50 generates the inertial data during the leakage test. In the illustrative embodiment, the inertial data includes data generated by the accelerometer 56 and the gyroscope 58. In some embodiments, in which the inertial measurement device 50 includes a GPS receiver 60, the inertial data may include data generated by the GPS receiver 60 that indicates a geolocation of the inertial measurement device 50. One example procedure for determining a sensor-based geolocation is shown and described in U.S. Pat. No. 10,057,725, which is incorporated herein by reference in its entirety. It should be appreciated that, in the illustrative embodiment, the controller 68 may receive the inertial data and leakage signals simultaneously during the leakage test, which is subsequently analyzed to determine whether a leakage is detected at the subscriber's premises 14 and the direction to the source of the leakage.

At step 108, the controller 68 may analyze the inertial data received from the inertial measurement unit 50 to determine the motion activity of the signal level meter 40 and hence the personnel operating the meter 40. To do so, the controller 68 may determine the orientation and/or angular velocity of the signal level meter 40 based on the inertial data. Based on the motion activity of the inertial measurement unit 50 and the signal levels of the test signals received via the antenna assembly 48, the controller 68 may determine a direction to the source of any detected leakage.

In one or more embodiments, the direction to the source of the detected leakage may be determined based on the following principles:

1) Linear Movement:

a) if a continuous increase in signal level is detected, the controller 68 determines that the linear direction of the meter 40 should remain as is. In one or more embodiments, if a graphical directional arrow is displayed on the meter 40 to show the meter's current movement (discussed below in more detail below), the controller 68 determines that the current arrow direction should continue to be displayed as the meter 40 is moving towards the source of the leakage.

b) if a continuous decrease in signal level is detected, the controller 68 determines that the linear direction of the meter 40 should be reversed. In one or more embodiments, if a graphical directional arrow is displayed on the meter 40 to show the meter's current movement, the controller 68 determines that the current arrow direction should be reversed as the meter 40 is moving away from the source of the leakage.

c) if a periodical signal level variation is detected, the controller 68 determines that an orthogonal change in direction of the meter 40 is required. A rotation estimate (discussed below) is required to determine whether the orthogonal change (i.e., rotation) is a forward or backward direction change.

2) Rotation:

a) if an increase in the signal level is detected, the controller 68 determines that the current travel direction of the meter 40 should remain as is (i.e., a forward rotation is required). In one or more embodiments, if a graphical directional arrow is displayed on the meter 40 to show the meter's current movement, the controller 68 determines that the current arrow direction should continue, but be rotated forward as the meter 40 is moving towards the source of the leakage.

b) if a decrease in the signal level is detected, the controller 68 determines that the current travel direction of the meter 40 should be rotated back with at the orthogonal same angle. In one or more embodiments, if a graphical directional arrow is displayed on the meter 40 to show the meter's current movement, the controller 68 determines that the current arrow direction should be rotated back as the meter 40 is moving away from the source of the leakage.

The above principles are based on experiments performed by the inventors. For example, continuous signal level variation was encountered when the tested meter was moved with the antenna oriented toward the source signal direction. Periodical signal level variation was encountered when the meter was moved with the antenna oriented orthogonal to the source signal direction.

At step 110, the controller 68 may present/update a graphical user interface on the display 62 of the meter 40. In one embodiment, a graphical direction-to-source indicator may be displayed on the user interface as a simple arrow or other directional indicator with a top portion of the display 62 serving as a reference point for the orientation of the direction-to-source indicator (and hence movement by the technician).

Figure 5:
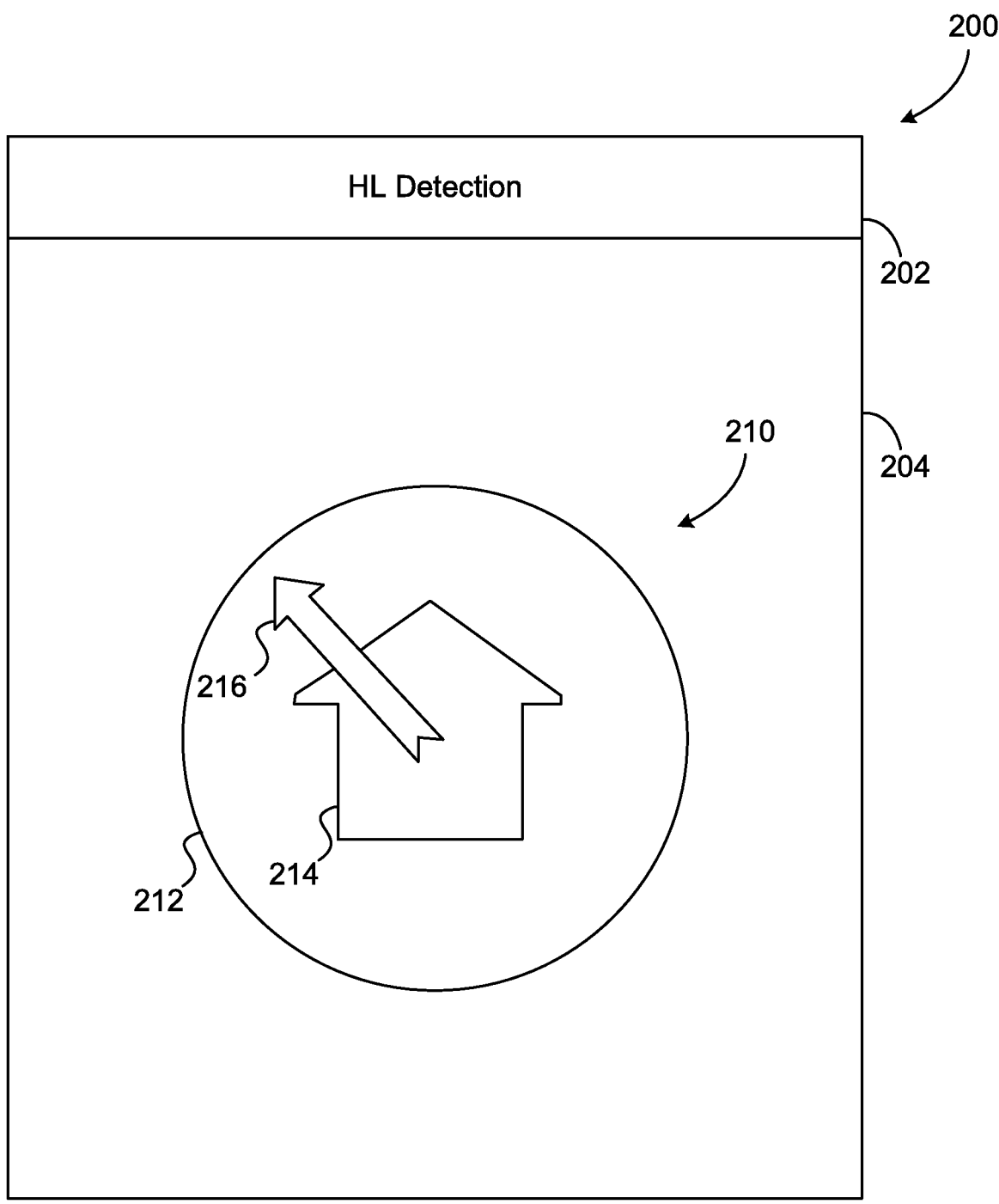
FIG. 5 shows an example of a user interface comprising an example graphical direction-to-source indicator that may be displayed on the signal level meter in accordance with the disclosed principles.

In one or more embodiments, the user interface may display the arrow or directional indicator within as compass-like graphical element. For example, as shown in FIG. 5, a user interface 200 may include a header portion 202 and a graphical portion 204. The illustrated header portion 202 may include text identifying what operation/function the meter 40 is currently executing (e.g., "HL Detection") and or the contents of the graphical portion 204 (e.g. direct to leakage source).

In the illustrated example, the graphical portion 204 includes a compass 210 comprising an outer portion 212, a direction of travel indicator 214 and graphical direction-to-source indicator 216. As can be appreciated, the calculations performed at step 108 are used to orient the direction-to-source indicator 216 with respect to the direction of travel indicator 214. In the illustrated example, the graphical direction-to-source indicator 216 is pointing approximately 45 degrees to the left of the direction of travel indicator 214. As such, the technician may alter its path based on the orientation of the graphical direction-to-source indicator 216.

Figure 6:
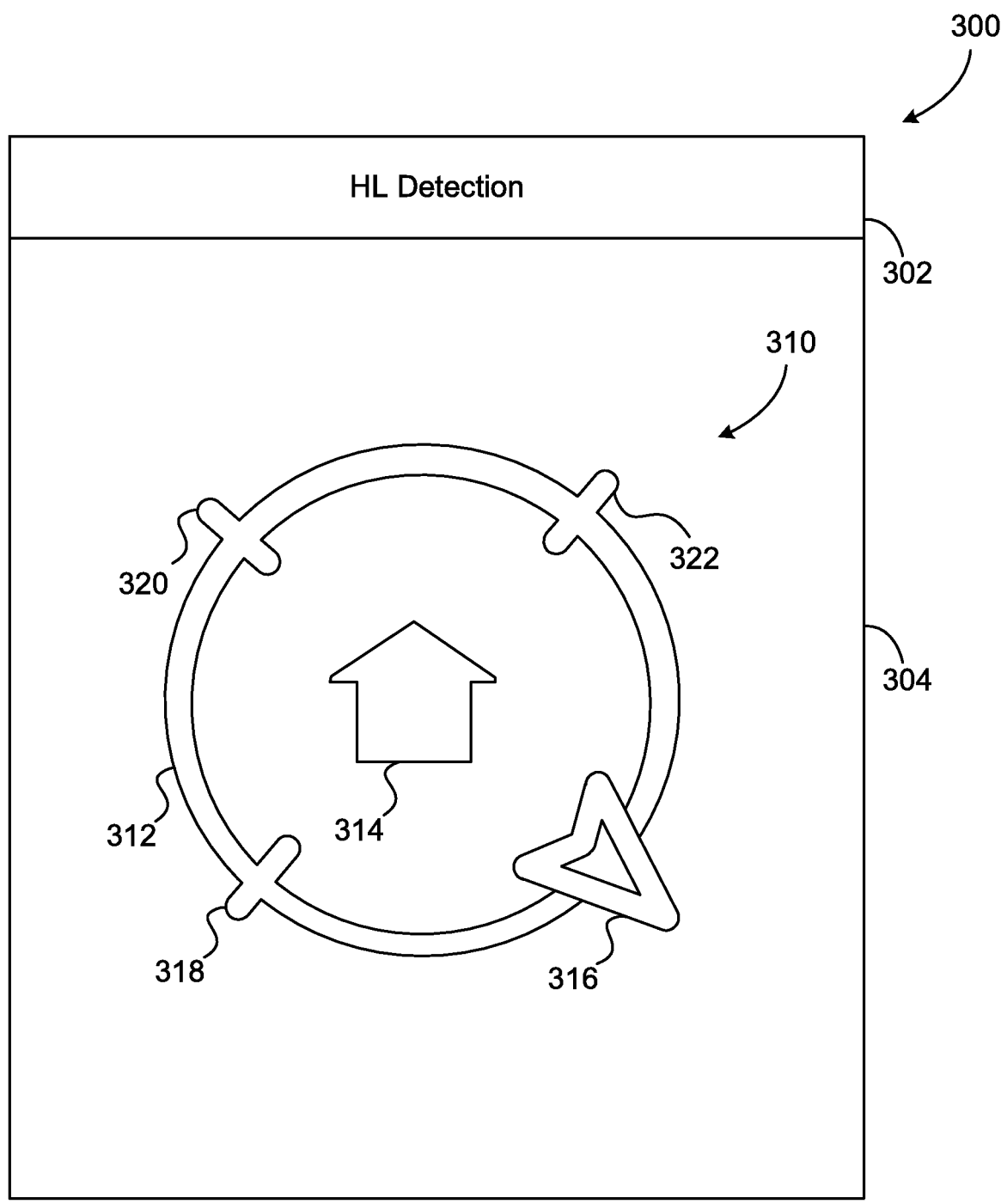
FIG. 6 shows an example of a user interface comprising another example graphical direction-to-source indicator that may be displayed on the signal level meter in accordance with the disclosed principles.

FIG. 6 illustrates another example user interface 300 that may be displayed and updated at step 110 of process 100. In the illustrated example, the user interface 300 may include a header portion 302 and a graphical portion 304. The illustrated header portion 302 may include text identifying what operation/function the meter 40 is currently executing (e.g., "HL Detection") and or the contents of the graphical portion 304 (e.g. direct to leakage source).

In the illustrated example, the graphical portion 304 includes a compass 310 comprising an outer portion 312, a direction of travel indicator 314 and graphical direction-to-source indicator 316. In the illustrated example, the outer portion 312 contains markers 318, 320, 322, which may serve as additional reference points for the technician. Although hidden from view, in one or more embodiments, the outer portion 312 would also include a marker at a point where the direction-to-source indicator 316 is currently positioned.

As can be appreciated, the calculations performed at step 108 are used to orient the graphical direction-to-source indicator 316 with respect to the direction of travel indicator 314. In the illustrated example, the graphical direction-to-source indicator 316 is pointing approximately 135 degrees to the right of the direction of travel indicator 314. As such, the technician may alter its path based on the orientation of the graphical direction-to-source indicator 316.

Referring again to FIG. 4, at step 112, the controller 68 determines whether the technician has stopped the test. For example, the controller 68 may stop the leakage test in response to receiving an indication from the maintenance/service technician to stop the leakage test (e.g., via a menu selection and or function key selection using the control buttons 76). If it is determined that the test has been stopped (e.g., a "No" at step 112), the process 100 terminates. If, however, it is determined that the test is not stopped (e.g., a "Yes" at step 112), the process 100 continues at step 104 for further processing.

It should be appreciated that while the disclosed principles are described as displaying a graphical direction-to-source indicator on the meter 40, the disclosed principles are not so limited. For example, in one or more embodiments, audible indications or instructions may be output by the meter 40 instead of or in addition to the graphical indications. In one or more embodiments, audible indications or instructions may be output by the meter 40 instead of or in addition to the graphical indications. In one or more embodiments, haptic indications (e.g., vibrations) may be output by the meter 40 instead of or in addition to the graphical indications. Regardless of the technique used, guidance for maintain or changing linear or rotational movement may be provided based on the disclosed principles.

The apparatus, system and method for determining and providing the direction to a leakage source disclosed herein provides numerous advantages over the current state of the art. For example, existing signal level meters and test instruments do not provide or support determining the direction to the source of leakage such as HL leakage. Moreover, existing signal level meters and test instruments do not provide a graphical direction-to-source indicator that may be used by the technician to quickly find a source of HL and other leakage. The disclosed principles, on the other hand, may make the HL Leakage detection faster and more precise as the technician is guided to the source by the graphical direction-to-source indicator. As can be appreciated, this may lead to quicker repairs, less downtime of the user's services, reduces labor costs by saving time and other resources, all of which are very desirable.

While various embodiments have been described above, it should be understood that they have been presented by way of example and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. For example, other steps may be provided, or steps may be eliminated, from the described flows, and other components may be added to, or removed from, the described systems. Accordingly, other implementations are within the scope of the following claims.

In addition, it should be understood that any figures which highlight the functionality and advantages are presented for example purposes only. The disclosed methodology and system are each sufficiently flexible and configurable such that they may be utilized in ways other than that shown.

Although the term "at least one" may often be used in the specification, claims and drawings, the terms "a", "an", "the", "said", etc. also signify "at least one" or "the at least one" in the specification, claims and drawings.

Finally, it is the applicant's intent that only claims that include the express language "means for" or "step for" be interpreted under 35 U.S.C. 112(f). Claims that do not expressly include the phrase "means for" or "step for" are not to be interpreted under 35 U.S.C. 112(f).

What is claimed is:

1. A computer-implemented method, said method being performed on a test instrument, said method comprising:
   receiving inertial data from an inertial measurement unit during a leakage test;
   receiving test signals from a network during the leakage test;
   analyzing the inertial data and signal levels of the received test signals;
   determining a direction to a source of leakage based on the analyzed inertial data and signal levels of the received test signals; and
   outputting a direction-to-source indication on the test instrument by:
      outputting a compass body on a display of the test instrument; and
      outputting a graphical direction-to-source indicator over the compass body.

2. The method of claim 1, wherein the inertial data indicates at least one of an orientation or an angular velocity of the test instrument during the leakage test.

3. The method of claim 2, wherein analyzing the inertial data and signal levels of the received test signals comprises determining at least one of the orientation or angular velocity of the test instrument based on the inertial data.

4. The method of claim 2, wherein determining the direction to the source of leakage based on the analyzed inertial data and signal levels of the received test signals comprises determining that a linear movement of the test instrument should be maintained when a continuous increase in the signal levels is detected.

5. The method of claim 2, wherein determining the direction to the source of leakage based on the analyzed inertial data and signal levels of the received test signals comprises determining that a linear movement of the test instrument should be reversed when a continuous decrease in the signal levels is detected.

6. The method of claim 2, wherein determining the direction to the source of leakage based on the analyzed inertial data and signal levels of the received test signals comprises determining that movement of the test instrument should be rotated orthogonally when a periodic change in the signal levels is detected.

7. The method of claim 6, wherein it is determined that the test instrument should be rotated in a first orthogonal direction when the periodic change in the signal levels is a periodic increase in the signal levels and wherein it is determined that the test instrument should be rotated in a second orthogonal direction when the periodic change in the signal levels is a periodic decrease in the signal levels.

8. The method of claim 1, wherein outputting the direction-to-source indication on the test instrument further comprises one of: outputting a textual direction-to-source indicator on the display of the test instrument, outputting an audible direction-to-source indicator on the test instrument, or outputting a haptic direction-to-source indicator on the test instrument.

9. An instrument system comprising:
a test instrument; and
an inertial measurement unit (IMU) coupled to or integrated within the test instrument, said IMU being operable to generate inertial data, the test instrument including a controller operable to:
receive inertial data from the IMU during a leakage test,
receive test signals from a network during the leakage test,
analyze the inertial data and signal levels of the received test signals,
determine a direction to a source of leakage based on the analyzed inertial data and signal levels of the received test signals, and
output a direction-to-source indication on the test instrument by:
outputting a compass body on a display of the test instrument; and
outputting a graphical direction-to-source indicator over the compass body.

10. The instrument system of claim 9, wherein the inertial data indicates at least one of an orientation or an angular velocity of the test instrument during the leakage test.

11. The instrument system of claim 10, wherein the controller analyzes the inertial data and signal levels of the received test signals by determining at least one of the orientation or angular velocity of the test instrument based on the inertial data.

12. The instrument system of claim 10, wherein the controller determines the direction to the source of leakage based on the analyzed inertial data and signal levels of the received test signals by determining that a linear movement of the test instrument should be maintained when a continuous increase in the signal levels is detected.

13. The instrument system of claim 10, wherein the controller determines the direction to the source of leakage based on the analyzed inertial data and signal levels of the received test signals by determining that a linear movement of the test instrument should be reversed when a continuous decrease in the signal levels is detected.

14. The instrument system of claim 10, wherein the controller determines the direction to the source of leakage based on the analyzed inertial data and signal levels of the received test signals by determining that movement of the test instrument should be rotated orthogonally when a periodic change in the signal levels is detected.

15. The controller of claim 14, wherein it is determined that the test instrument should be rotated in a first orthogonal direction when the periodic change in the signal levels is a periodic increase in the signal levels and wherein it is determined that the test instrument should be rotated in a second orthogonal direction when the periodic change in the signal levels is a periodic decrease in the signal levels.

16. The instrument system of claim 9, wherein the controller further outputs the direction-to-source indication on the test instrument by one of: outputting a textual direction-to-source indicator on the display of the test instrument, outputting an audible direction-to-source indicator on the test instrument, or outputting a haptic direction-to-source indicator on the test instrument.

* * * * *